United States Patent [19]
Nienaber

[11] Patent Number: 5,394,020
[45] Date of Patent: Feb. 28, 1995

[54] VERTICAL RAMP AUTOMATIC AMPLITUDE CONTROL

[75] Inventor: David K. Nienaber, Rolling Meadows, Ill.

[73] Assignee: Zenith Electronics Corporation, Glenview, Ill.

[21] Appl. No.: 998,282

[22] Filed: Dec. 30, 1992

[51] Int. Cl.$^6$ .............................................. H03K 4/06
[52] U.S. Cl. ....................... 327/140; 327/35; 327/58; 327/74; 327/131; 327/132; 327/134; 327/137; 327/146; 327/181
[58] Field of Search ................ 307/228, 234, 246, 261, 307/263, 264, 265, 269, 351, 354, 360, 491, 517, 518, 519, 296.2, 296.4, 296.6, 361; 328/35, 63, 127, 146, 181

[56] References Cited

U.S. PATENT DOCUMENTS

| | | | |
|---|---|---|---|
| 3,713,000 | 1/1973 | Driskell et al. | 328/181 |
| 3,723,907 | 3/1973 | Tajchman et al. | 328/181 |
| 3,859,603 | 1/1975 | Herzner | 328/181 |
| 3,893,036 | 7/1975 | Cavoretto | 328/181 |
| 3,932,741 | 1/1976 | Hanson | 328/181 |
| 4,284,906 | 8/1981 | Manfredi | 328/181 |
| 4,404,481 | 9/1983 | Ide et al. | 328/181 |
| 4,408,130 | 10/1983 | Boll | 307/296.6 |
| 4,775,841 | 10/1988 | Trofimenkoff et al. | 307/261 |
| 5,013,931 | 5/1991 | Esters, Jr. | 328/181 |
| 5,107,138 | 4/1992 | Seki et al. | 307/296.6 |
| 5,120,984 | 6/1992 | Klatser | 307/246 |
| 5,168,174 | 12/1992 | Naso et al. | 307/296.6 |
| 5,208,842 | 5/1993 | Atwood et al. | 307/296.6 |

FOREIGN PATENT DOCUMENTS

| | | | |
|---|---|---|---|
| 0115037 | 8/1984 | European Pat. Off. | 328/181 |
| 0144650 | 12/1978 | Japan | 328/181 |
| 0070130 | 5/1980 | Japan | 328/181 |

Primary Examiner—Timothy P. Callahan
Assistant Examiner—Terry D. Cunningham

[57] ABSTRACT

A vertical ramp generator includes a voltage controllable charge current source and a switched discharge current source coupled across a ramp capacitor. A pair of comparators coupled to first and second reference potentials are supplied with the ramp capacitor voltage and drive a flip/flop, the output of which operates the discharge current source. A sync signal voltage is injected into the output of one of the comparators. Another comparator compares the ramp capacitor voltage with a third reference potential corresponding to the midpoint of the desired ramp voltage to control the switching of a pair of current sources that supply a square wave current to a correction capacitor which develops a DC correction voltage. The duty cycle of the square wave current is a function of the deviation of the ramp capacitor voltage from the third reference potential. The correction voltage controls the amount of current supplied by the charge current source. An override circuit responds to a predetermined voltage across the ramp capacitor to switch another current source that increases the current to the correction capacitor to increase the DC correction voltage and reduce the current supplied to the ramp capacitor by the charge current source.

7 Claims, 2 Drawing Sheets

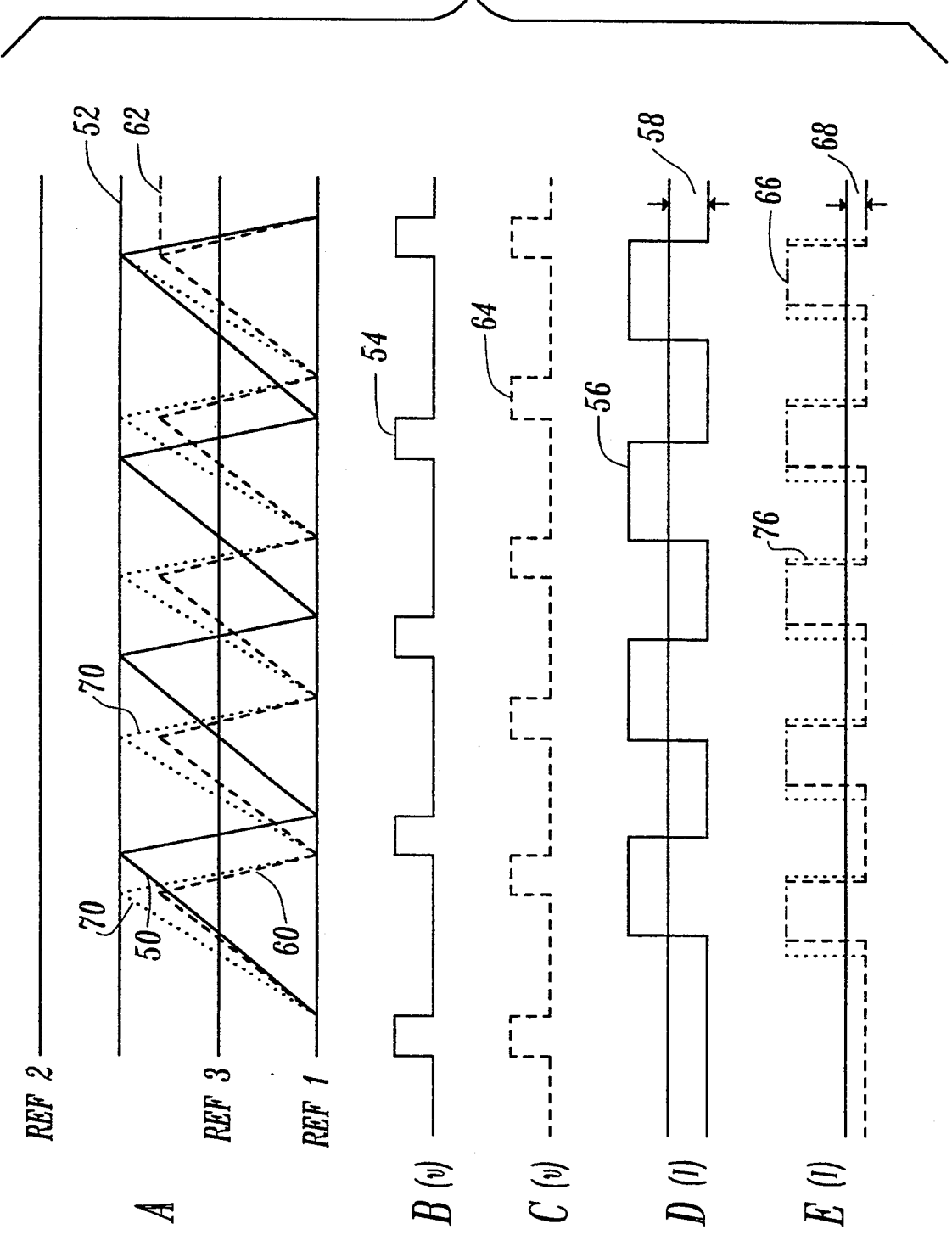

VERTICAL RAMP AUTOMATIC AMPLITUDE CONTROL

BACKGROUND OF THE INVENTION AND PRIOR ART

This invention relates generally to multi frequency vertical deflection signal generator circuits and specifically to vertical signal generator circuits for producing a synchronized sawtooth (ramp) output voltage over a range of input synchronizing signal frequencies.

The prior art includes a number of circuit arrangements using a capacitor that is charged from a constant current source to form the ramp voltage and means for changing the current from the current source in response to changes in the input sync condition (frequency). The ramp generator is often used with upper and lower voltage level sensing comparators that alternately set and reset a flip/flop which, when activated, discharges the ramp capacitor. The arrangement comprises an oscillator that can be triggered by injecting a sync signal, either to the ramp voltage, or directly to the flip/flop, for initiating discharge of the ramp capacitor. This is referred to as an injection locked oscillator system.

Changing the current supplied to the ramp capacitor in an injection locked system results in a change in the free running (no sync) frequency. Changing the ramp current when sync is applied doesn't result in a frequency change, but rather changes the amplitude of the resultant ramp, provided the current adjustment is not so high as to cause the free running frequency to exceed the injected sync frequency.

The prior art discloses many open loop systems that attempt to maintain a constant, or at least a predictable, vertical height under multi frequency operations. Some systems use a microprocessor to control the ramp current, while others use discrete logic to switch between different levels of ramp current. The selection of various levels of ramp current is usually dependent on the frequency and polarity of horizontal and vertical sync. Such systems are subject to error due to variations in capacitors and current sources and changes over time and in temperature and errors in measured sync frequency. Such systems are also subject to errors when used with uncommon or unrecognized display signal formats.

SUBJECTS OF THE INVENTION

A principal object of the invention is to provide a novel vertical ramp generator circuit.

Another object of the invention is to provide a vertical ramp circuit that produces a constant amplitude ramp over a wide range of synchronizing frequencies.

A further object of the invention is to provide an injected sync closed loop type of vertical ramp generator.

BRIEF DESCRIPTION OF THE DRAWINGS

These and other objects and advantages of the invention will be apparent upon reading the following description in conjunction with the drawings, in which:

FIG. 2 is a series of waveforms illustrating operation of the circuit of FIG. 1.

DESCRIPTION OF THE PREFERRED EMBODIMENT

Figure 1:
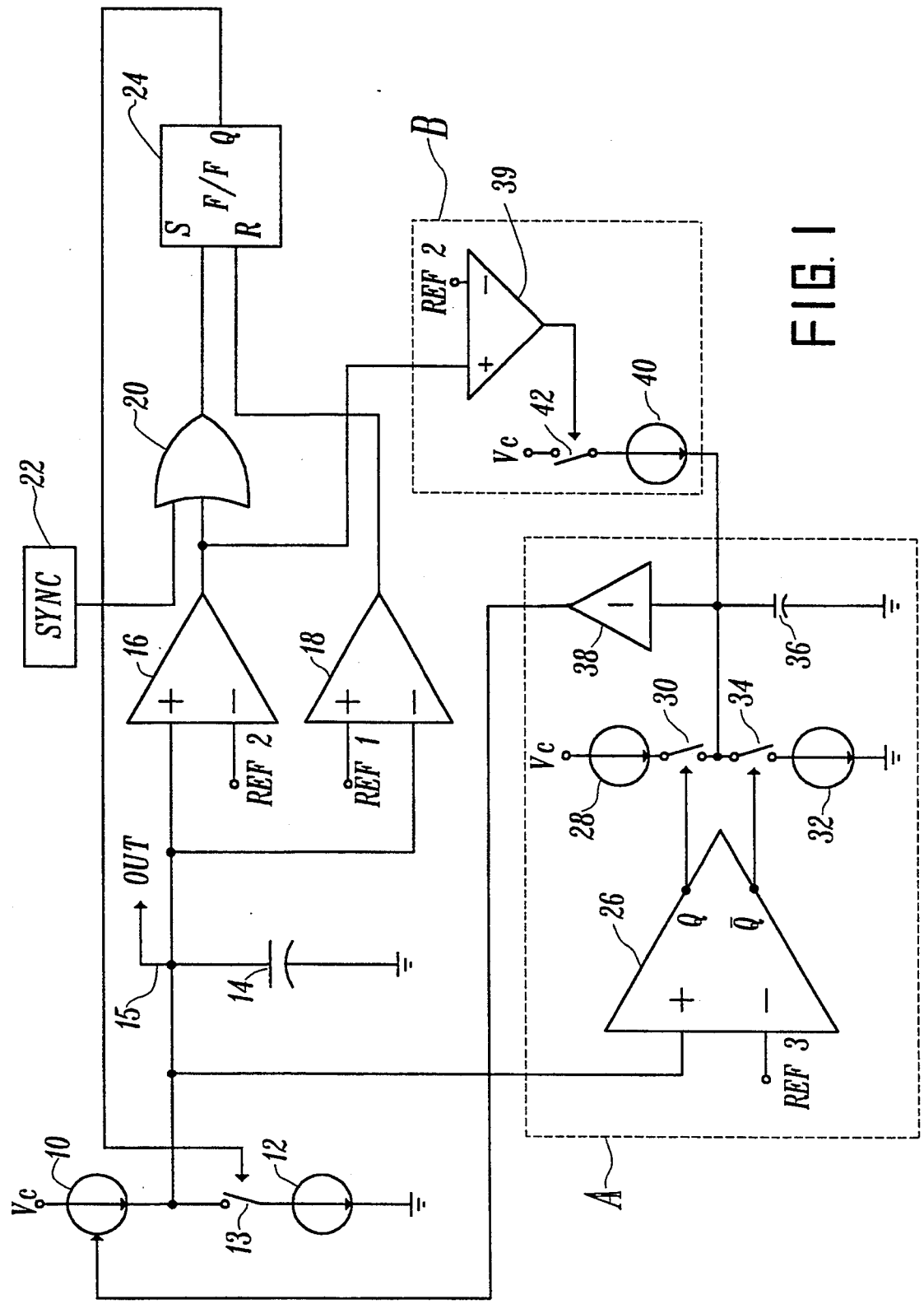
FIG. 1 is a partial schematic diagram of a vertical ramp generator constructed in accordance with the invention.

Referring to FIG. 1, a voltage controllable charge current source 10 is coupled between a source of positive voltage Vc and the junction 15 of a switch 13 and a ramp capacitor 14. Current source 12 and ramp capacitor 14 are returned to ground potential. Junction 15, which is the output of the circuit, in turn is coupled to the positive input of a comparator 16 and the negative input of a comparator 18. The negative input of comparator 16 is connected to a reference source REF 2 and the positive input of comparator 18 is connected to a reference source REF 1. The output of comparator 16 is coupled to one input of an OR gate 20, the other input of which is supplied with a sync signal from a sync source 22. The output of OR gate 22 is coupled to the S input of a flip/flop 24, the R input of which is coupled to the output of comparator 18. The output of flip/flop 24 operates switch 13 that enables discharge current source 12 to discharge ramp capacitor 14.

Another comparator 26 has its positive input connected to ramp capacitor 14 (junction 15) and its negative input coupled to a third source of reference potential REF 3. Its Q output controls a switch 30 that is connected in series with a current source 28 and its $\overline{Q}$ output controls a switch 34 that is connected in series with a current source 32. Current sources 28, 32 and switches 30, 34 are serially connected between Vc and ground. The junction of switches 30 and 34 is connected to a correction capacitor 36 which, via an inverter 38, controls the amount of current produced by charge current source 10. The arrangement of comparator 26, current sources 28 and 32, switches 30 and 34, correction capacitor 36 and inverter 38 is enclosed by a dashed line box A. The elements represent the preferred implementation of the invention. Yet it should be apparent that a more general arrangement of an amplitude detector, a reference comparator and a correction capacitor may also be used to practice the invention.

An override circuit (dashed line box B) includes another comparator 39 for sensing a predetermined voltage (REF 2) at the output of comparator 16 to operate a switch 42 to connect a current source 40 to correction capacitor 36. As will be seen, the correction voltage is increased to reduce the charge current to ramp capacitor 14.

The operation of the circuit of the invention is best understood by reference to FIG. 2 in conjunction with FIG. 1. FIG. 2 shows a series of waveforms A–E that illustrate different conditions of operation of the ramp generator. In waveform A, the solid line 50 represents the ramp voltage produced when the system is stable with a given frequency of injected sync signal voltage (V) 54 (waveform B). The ramp has a minimum amplitude of REF 1, a maximum amplitude 52 less than REF 2 and a midpoint amplitude of REF 3. Waveform B represents the sync signal voltage injected into the circuit of FIG. 1 that results in synchronized ramp 50. Waveform D represents the current (I) 56 supplied to correction capacitor 36. Current 56 is a square wave with a 50% duty cycle and produces a DC level 58 that develops a corresponding DC correction voltage on correction capacitor 36.

As ramp capacitor 14 is supplied current from charge current source 10, its voltage follows the rising portion of solid line 50. This voltage is coupled to comparators 16 and 18, and when it equals REF 1, the output of comparator 18 sends a reset signal to flip/flop 24. As long as the voltage across ramp capacitor 14 is below the REF 2 voltage (applied to a negative input of comparator 16), a low input is applied to OR gate 20. Since the sync signal voltage is normally low, the output of OR gate 20 is low. When either the sync signal or the output of comparator 16 goes high, the output of OR gate 20 switches high and triggers flip/flop 24, the Q terminal of which applies a signal to close switch 13 and enables removal of current from ramp capacitor 14 by discharge current source 12. As seen in FIG. 2 (A, B and D), this action results in a ramp voltage 50 that is equally displaced about REF 3. In particular, square wave current 56 (D), which has an average value 58, has a 50% duty cycle.

The dashed line ramp voltage waveform 60 (A) and dashed line sync voltage waveform 64 (C) and dashed line correction capacitor current waveform 66 (E) illustrate the conditions when a higher frequency sync signal is received. The trigger point of waveform 60 occurs earlier because the sync signal 64 occurs earlier. Consequently, the amplitude 62 of waveform 60 is less than amplitude 52 of waveform 50. This change in amplitude is undesirable and is overcome by the invention. The correction is enabled because of the duty cycle of the square wave current supplied to the correction capacitor 36 (E). Specifically, the sync pulse 64 from flip/flop 24 occurs early which connects the discharge current source 12 earlier to generate waveform 60 of lower amplitude 62. Correction capacitor 36, which is supplied with current by current sources 28 and 32 via comparator 26, is charged for a shorter time and discharged for a longer time. Thus, the average current 68 supplied to correction capacitor 36 is smaller than the average current 58 produced with a 50% duty cycle square wave current shown in (D). This results in a lower DC correction voltage which, when passed through inverter 38, results in an increased current from charge current source 10. The resultant adjustment in charge current produces the dotted line ramp waveform 70 which now has the same amplitude 52 despite the higher frequency sync signal 64. As shown in (E), the dotted line square wave current 76 which has a 50% duty cycle, is produced when the circuit stabilizes at the new frequency. A similar operation occurs for sync signals of lower frequency. The generator adjusts to produce a constant amplitude ramp.

An override circuit, represented by comparator 39, current source 40 and switch 42, is incorporated in the event of a rapid change to a much lower sync signal frequency which could result in the voltage at comparator 16 rising to the REF 2 level before the sync pulse occurs. In that instance, while not shown in the waveforms, the flip/flop 24 would be triggered when the positive input of comparator 16 reaches REF 2 to activate discharge current source 12 before arrival of the sync signal. After discharge to REF 1 level, flip/flop 24 will reset and the ramp capacitor will commence charging and generate another ramp. The occurrence of the sync pulse will now trigger flip/flop 24 to activate discharge source 12 and discharge the ramp capacitor 14. This could result in an unstable condition where the ramp alternates between a high peak and a low peak amplitude. The situation is prevented by sensing the voltage at the output of comparator 16 rising to REF 2 level (by means of comparator 39) and operating switch 42 to connect current source 40 to supply extra current to correction capacitor 36, which rapidly increases the DC correction voltage. The rapid rise in voltage on correction capacitor 36 overrides the normal correction voltage resulting in a decrease in the amount of current conducted by charge current source 10 and a slowing down of the rate of rise of the ramp so that it is triggered by the sync pulse before the voltage from comparator 16 reaches REF 2.

What has been described is a novel constant amplitude vertical ramp generator which utilizes an injected sync and a closed loop control system. It is recognized that numerous changes in the described embodiment of the invention will be apparent to those skilled in the art without departing from its true spirit and scope. The invention is to be limited only as defined in the claims.

What is claimed is:

1. A method of producing a constant amplitude deflection ramp voltage over a range of deflection frequencies comprising:
   producing a ramp voltage by charging a ramp capacitor from a current source;
   a first controllable current source for charging said ramp capacitor and a second switched current source for discharging said ramp capacitor;
   controlling the frequency of said ramp voltage with an injected sync signal;
   generating a correction signal based upon deviation of the amplitude of said ramp voltage from a reference;
   coupling said correction signal to said current source for compensating said deviation; and
   comparing the voltage on said ramp capacitor to first and second reference potentials, said ramp capacitor being coupled between the junction of said first and second current sources and ground and operating said second current source responsive to the results of said comparison and to said injected sync signal.

2. The method of claim 1, further comprising comparing the voltage on said ramp capacitor with a third reference potential intermediate said first and said second reference potentials and switching another pair of current sources across a correction capacitor for developing said correction voltage.

3. A method of developing a constant amplitude vertical ramp voltage over a range of frequencies comprising:
   developing said ramp voltage by controlling the charge and discharge of a ramp capacitor from first and second current sources;
   utilizing a comparator circuit coupled to said ramp capacitor and to first and second reference voltages and an injected sync signal for developing a signal for operating said second current source for discharging said ramp capacitor;
   comparing the ramp capacitor voltage to a third reference voltage and developing a DC correction voltage; and
   applying the DC correction voltage to said first current source for controlling the charging current supplied to said ramp capacitor.

4. The method of claim 3, further including overriding the correction voltage in the event the output voltage on said ramp capacitor reaches said second reference voltage.

5. A constant amplitude vertical ramp generator comprising:
   a charge and a discharge current source;

a ramp capacitor coupled to said charge and discharge current sources for developing a ramp voltage;

first comparator means for comparing the voltage across the ramp capacitor with first and second reference potentials;

means for supplying a sync signal;

flip/flop means responsive to said first comparator means and to said sync signal for operating said discharge current source;

second comparator means comparing the voltage across said ramp capacitor with a third reference potential;

means for generating a DC correction voltage coupled to said second comparator means; and means for applying said DC correction voltage to said charge current source for controlling the current supplied to said ramp capacitor.

6. The generator of claim 5, wherein said DC correction voltage means comprise charge and discharge current sources supplying a square wave current to a correction capacitor.

7. The generator of claim 6, further including means responsive to said ramp voltage increasing to said second reference potential for overriding said DC correction voltage means and forcing an increase in said charge current to said ramp capacitor.

* * * * *